United States Patent [19]

Takayanagi et al.

[11] Patent Number: 5,792,595
[45] Date of Patent: Aug. 11, 1998

[54] METAL PATTERN FORMING METHOD AND PHOTOSENSITIVE SHEET

[75] Inventors: Takashi Takayanagi; Masamichi Shigyo; Makoto Tanaka; Toshihiro Oda; Yasunori Kobayashi; Fumiaki Shinozaki, all of Shizuoka, Japan

[73] Assignee: Fuji Photo Film Company, Limited, Kanagawa, Japan

[21] Appl. No.: 608,495

[22] Filed: Feb. 28, 1996

[30] Foreign Application Priority Data

Feb. 28, 1995 [JP] Japan ................... 7-065035

[51] Int. Cl.$^6$ ............... G03C 5/00; G03C 11/12; B32B 3/00
[52] U.S. Cl. ............ 430/325; 430/271.1; 430/258; 430/259; 428/200; 428/202
[58] Field of Search ................ 430/325, 258, 430/271.1, 329, 359, 313; 428/202, 204, 200

[56] References Cited

U.S. PATENT DOCUMENTS

| | | | |
|---|---|---|---|
| 4,654,296 | 3/1987 | Held | 430/325 |
| 5,041,356 | 8/1991 | Takeda et al. | 430/270 |
| 5,615,030 | 3/1997 | Harada et al. | 349/110 |

*Primary Examiner*—Janet C. Baxter
*Assistant Examiner*—Rosemary Ashton
*Attorney, Agent, or Firm*—Birch, Stewart, Kolasch & Birch, LLP

[57] ABSTRACT

A photosensitive sheet is composed of a plastic film, a subbing layer for nonelectrolytic plating provided thereon consisting of a hydrophilic resin having swelling property and fine particles of a metal or a metallic compound, a nonelectrolytically plated layer provided on the subbing layer and the photoresist layer provided on the nonelectrolytically plated layer. A metal pattern is performed by the steps of: exposing patternwise to light the photoresist layer of the photosensitive sheet, developing the exposed photoresist layer to form a resist pattern on the nonelectrolytically plated layer; forming an electrolytically plated layer on the nonelectrolytically plated layer in the area having no resist; superposing the photosensitive sheet on a substrate; and separating the plastic film from the substrate, keeping both the resist pattern and the electrolytically plated layer on the substrate, to form a metal pattern on the substrate.

12 Claims, 3 Drawing Sheets

(va)

(via)

(viia)

METAL PATTERN FORMING METHOD AND PHOTOSENSITIVE SHEET

FIELD OF THE INVENTION

The present invention relates to a metal pattern forming method, and further relates to a photosensitive sheet, a sheet provided with a nonelectrolytically plated layer and a sheet for formation of a nonelectrolytically plated layer which are favorably employable for the method.

BACKGROUND OF THE INVENTION

Recently, required reduction of size and weight of electronic equipment has brought about a demand for an increase of density and layer in metal circuit boards such as a print circuit board. As methods for preparation of print circuit board, there have been known two methods for a subtractive method utilizing an etching procedure such as a panel plating method or a pattern plating method, and an additive method such as a full additive method.

The subtractive method includes a process of forming a metal circuit (e.g., copper circuit) by etching the metal (i.e., etching procedure). The etching procedure, however, gives occurrence of side etching (i.e., unfavorable etching of side face of circuit) and therefore a section view of the circuit (wiring portion) is liable to become a trapezoid. The trapezoid-shaped circuit is not suitable for formation of highly condensed metal circuit. Further, the etching procedure does not efficiently utilize a metal, and it results in necessity of treatment of a large amount of an etching waste liquid.

In contrast, the additive method comprises the steps of forming a negative circuit pattern (negative pattern corresponding circuit pattern) on a substrate by using photoresist, and depositing a metal (e.g., copper) on the substrate by nonelectrolytic plating to form the negative circuit pattern. The method is free from occurrence of the side etching in the subtractive method, and therefore relaxes the critical width of the wiring of the circuit. The method thus enables formation of a circuit pattern of high density. Further, the method does not need treatment of the etching waste liquid due to the fact that it includes no etching procedure, and further it utilizes the metal in high efficiency. However, the metal deposition by nonelectrolytic plating needs a long time to form a circuit pattern, which results in decrease of productivity. Further, to subject the substrate to nonelectrolytic plating, it is required to conduct complicated pretreatments such as degreasing treatment, acid treatment, addition of a catalyst for plating and treatment for activating the surface of substrate.

For the reasons, a transfer method has been developed instead of the additive method utilizing nonelectrolytic plating. The transfer method comprises the steps of: forming a negative pattern circuit by the use of photoresist on a surface of a support having electrical conductivity; forming a metal layer (e.g., copper layer) on the support in an area having no resist by electrolytic plating; and transferring the metal layer (and the resist) onto an insulating substrate. The transfer method is free from occurrence of the side etching, and the formation of the metal layer can be conducted within a short time. Hence, the transfer method enables preparation of a circuit pattern of high density within a short time.

The transfer method is described in the following publications.

Japanese Patent Provisional Publication No. 63(1988)-187695 discloses a transfer method comprising the steps of: forming a resist pattern on a support having electrical conductivity (e.g., stainless steel sheet), forming a layer of electrolytic plating on the support in an area having no resist pattern, and then transferring the electrolytically plated layer onto a substrate together with the resist pattern.

Japanese Patent Provisional Publication No. 63(1988)-283886 discloses a transfer method comprising the steps of: forming a resist pattern on an electrically conductive layer formed on a film (e.g., metal layer formed on the film via a release layer by means of vacuum deposition or plasma beam deposition), forming a layer of electrolytic or nonelectrolytic plating on the electrically conductive layer in an area having no resist pattern, and then transferring the (non)electrolytically plated layer onto an insulating substrate together with the resist pattern.

Further, Japanese Patent Provisional Publication No. 2(1990)-122691 discloses a transfer method comprising the steps of: forming a photoresist layer on a support such as a metal tape on which copper plating can be formed, etching the photoresist layer to form a resist pattern, plating with copper the support in an area having no resist pattern, making a surface of the copper plating layer rough, removing the resist pattern, superposing the support having the copper plating layer on an insulating substrate via an adhesive to combine them, and separating the support from the substrate to form a metal pattern on the substrate.

In the above three transfer methods, the method employing a metal sheet or tape as an initial support for forming a metal layer is low in workability and economical efficiency because the metal sheet or tape has a heavy weight and a high cost. Further, when the metal layer formed on the metal sheet (or tape) is transferred to the insulating substrate, the separation (peeling) of the metal layer from the metal sheet cannot be smoothly carried out. On the other hand, when the formation of the metal layer is conducted by utilizing vacuum deposition, the formation needs a long time and therefore is lowered in workability and economical efficiency.

SUMMARY OF THE INVENTION

An object of the present invention is to provide a novel metal pattern forming method in which the metal forming method utilizing a transfer method is improved in workability and economical efficiency, especially in which a metal pattern having a highly smooth surface can be obtained.

Another object of the invention is to provide an improved metal pattern forming method utilizing a transfer method which is suitable for the preparation of a print circuit board.

A further object of the invention is to provide a photosensitive sheet, a sheet provided with a nonelectrolytically plated layer and a sheet for formation of a nonelectrolytically plated layer, which are favorably employable for the metal pattern forming method utilizing a transfer method.

There is provided by the present invention a metal pattern forming method comprising the steps of:

exposing patternwise to light a photoresist layer of a photosensitive sheet, the photosensitive sheet comprising a plastic film, a subbing layer for nonelectrolytic plating provided thereon comprising a hydrophilic resin having swelling property and fine particles of a metal or a metallic compound dispersed therein, a nonelectrolytically plated layer provided on the subbing layer and the photoresist layer provided on the nonelectrolytically plated layer;

developing the exposed photoresist layer to form a resist pattern on the nonelectrolytically plated layer, whereby the nonelectrolytically plated layer has an area having resist and an area having no resist;

forming an electrolytically plated layer on the nonelectrolytically plated layer in the area having no resist;

superposing the photosensitive sheet on a substrate in such manner that the resist pattern and the electrolytically plated layer are in contact with a surface of the substrate; and separating the plastic film from the substrate, keeping both the resist pattern and the electrolytically plated layer on the substrate, to form a metal pattern on the substrate.

Further, there is also provided by the present invention a metal pattern forming method comprising the steps of:

exposing patternwise to light the photoresist layer of the above photosensitive sheet;

developing the exposed photoresist layer to form a resist pattern on the nonelectrolytically plated layer, whereby the nonelectrolytically plated layer has an area having resist and an area having no resist;

forming an electrolytically plated layer on the nonelectrolytically plated layer in the area having no resist;

removing the resist pattern to leave the electrolytically plated layer on the nonelectrolytically plated layer;

superposing the photosensitive sheet on a substrate in such manner that the resist pattern and the electrolytically plated layer are in contact with a surface of the substrate; and separating the plastic film from the substrate, keeping the electrolytically plated layer on the substrate, to form a metal pattern on the substrate.

The photosensitive sheet preferably has a structure wherein the nonelectrolytically plated layer and the subbing layer are united under the condition that a part of the nonelectrolytically plated layer enters the subbing layer, whereby no clear boundary is observed between the nonelectrolytically plated layer and the subbing layer.

In the metal pattern forming method, it is preferred that a surface of the metal pattern on the substrate is further subjected to an etching treatment to smooth the surface.

The method of the invention preferably employs the photosensitive sheet wherein a plastic film, a subbing layer for nonelectrolytic plating comprising a hydrophilic resin having swelling property and fine particles of a metal or a metallic compound dispersed therein, a nonelectrolytically plated layer and the photoresist layer are superposed in order, as described above. The hydrophilic resin is preferably cross-linked, and an undercoat layer comprising adhesive resin is preferably formed between the plastic film and the subbing layer.

The nonelectrolytically plated layer of the photosensitive sheet of the invention has a subbing layer of hydrophilic resin having swelling property thereunder, which gives the plastic film an appropriate strength. Although the nonelectrolytically plated layer is not peeled off in the procedures such as electrolytic plating, separating of the plastic film from the substrate (transfer of the resist pattern and the electrolytically plated layer to the substrate) can be smoothly conducted. Thus, to conduct the metal pattern forming method utilizing the photosensitive sheet of the invention enables formation of a metal pattern having a smooth surface in improved workability and economical efficiency.

Hence, the metal pattern forming method of the invention is utilized especially advantageously for the preparation of a print circuit board having highly fine circuit.

DETAILED DESCRIPTION OF THE INVENTION

The photosensitive sheet employed in the invention and the metal pattern forming method employing the sheet according to the invention are explained hereinafter in more detail.

The photosensitive sheet employed in the metal pattern forming method of the invention has a structure which comprises a plastic film, a subbing layer for nonelectrolytic plating provided thereon comprising a hydrophilic resin having swelling property and fine particles of a metal or a metallic compound dispersed therein, a nonelectrolytically plated layer provided on the subbing layer and the photoresist layer provided on the nonelectrolytically plated layer.

In order to prepare the photosensitive sheet, a sheet for formation of a nonelectrolytically plated layer is first prepared. The sheet for formation of a nonelectrolytically plated layer comprises a plastic film and a subbing layer for nonelectrolytic plating provided thereon comprising a hydrophilic resin having swelling property and fine particles of a metal or a metallic compound dispersed in the resin.

Figure 1:
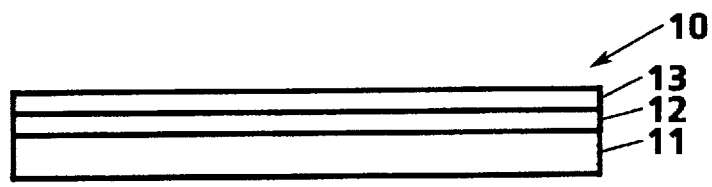
FIG. 1 is a section view showing a structure of a sheet for formation of a nonelectrolytically plated layer employed in the metal pattern forming method of the invention.

The structure of the sheet for formation of a nonelectrolytically plated layer of the invention is shown in FIG. 1. In FIG. 1, the sheet for formation of a nonelectrolytically plated layer 10 comprises a plastic film (functioning as support) 11, an undercoat layer 12 comprising a hydrophobic binder, and a subbing layer for nonelectrolytic plating 13 in which fine particles of a metal or a metallic compound are dispersed in a hydrophilic resin having swelling property.

Any plastic materials can be employed for forming the plastic film employed as a support of the sheet for formation of a nonelectrolytically plated layer. Examples of the plastic materials include cellulose esters, polyamide, polycarbonate, polyester (e.g., polyethylene terephthalate, poly-1,4-cyclohexanedimethylene terephthalate, polyethylene-1,2-diphenoxyethane-4,4'-dicarboxylate or polyethylene-2,6-naphthalate), polystyrene, polyolefin (e.g., polypropylene or polyethylene), polyimide, polyamideimide and polyethersulfone. The plastic material can be employed in combination, or two or more plastic films of the materials can be superposed.

The material for the plastic film (support) preferably has high dimensional stability. In more detail, the plastic film preferably has thermal expansion coefficient of not more than $1 \times 10^{31}$ $^{4}$/°C., and preferably has ratio of humidity dimensional change of not more than $1 \times 10^{-4}$% RH (especially not more than $1 \times 10^{-5}$% RH).

Preferred is a polyethylene terephthalate film. The most preferred film is a biaxially stretched and heat-relaxed polyethylene terephthalate film from the viewpoints of economical efficiency, dimensional stability, strength and smoothness. Also preferred are polethylene-2,6-naphthalate described in Japanese Patent Provisional Publication No. 5(1994)-25916, and syndiotactic polystyrene (SPS) described in Japanese Patent Provisional Publication No. 63(1988)-55615.

The thickness of the plastic film (support) is not especially restricted in the invention. The thickness generally is in the range of 6 to 200 μm, and preferably in the range of 50 to 180 μm. The plastic film may be transparent or opaque. If desired, the plastic film may contain additives or fillers such as dyes, pigments (e.g., titanium dioxide) or lubricants (e.g., silica, calcium carbonate).

The sheet for formation of a nonelectrolytically plated layer of the invention is characterized in that the subbing layer for nonelectrolytic plating comprising a hydrophilic resin having swelling property and fine particles of a metal or a metallic compound dispersed therein is formed on the plastic film. The subbing layer is preferably provided on the plastic film via an undercoat layer comprising adhesive resin. The undercoat layer enables the subbing layer to uniformly and firmly fix on the surface of the plastic film, and to keep the uniformly fixation for a long timed of period.

Examples of resins for the undercoat layer include hydrophobic resins such as a homopolymer and a copolymer derived from at least one monomer which is selected from the group consisting of vinyl chloride, vinylidene chloride, methacrylic acid, acrylic acid, methacrylic acid ester, acrylic acid ester, itaconic acid, maleic anhydride, vinyl acetate, butadiene and styrene; and materials obtained by cross-linking the resins with a crosslinking agent (e.g., 2,4-dichloro-6-oxy-s-triazine). Examples of the hydrophobic resins include butadiene/styrene copolymer latex and polyvinylidene chloride latex.

The resins preferably have a molecular weight (weight-average molecular weight) of more than 5,000, especially a molecular weight of 20,000 to 2,000,000. The melting point preferably is in the range of 120° to 250° C.

A thickness of the adhesive layer generally is in the range of 0.01 to 5.0 μm, preferably in the range of 0.1 to 1.0 μm.

The undercoat layer can be formed by the conventional method which comprises coating a melted binder resin on the plastic film, or coating a solution containing the binder resin on the film and drying the coated solution layer. Prior to the coating of the binder resin, the surface of the plastic film is preferably subjected to the known surface treatment (e.g., corona discharge treatment, glow discharge treatment, plasma treatment, flame treatment or chemical treatment), in order to improve bonding strength between the binder resin and the plastic film.

Further, the plastic film having the undercoat layer also preferably shows little change in dimensions in length and cross directions even after having been stored at high temperatures.

On the undercoat layer of the plastic film (on which the undercoat layer is provided), formed is a subbing layer for nonelectrolytic plating comprising a hydrophilic resin having swelling property and fine particles of a metal or a metallic compound dispersed therein.

The subbing layer for nonelectrolytic plating of the sheet for formation of a nonelectrolytically plated layer according to the invention, is provided with a surface having hydrophilic property and swelling property. Therefore, a plating solution deeply permeates into the subbing layer for nonelectrolytic plating in the case that the sheet for forming a nonelectrolytically plated layer is dipped in the plating solution. Further, the nonelectrolytic plating is conducted by utilizing the fine particles of a metal or a metallic compound dispersed in the subbing layer as nucleus, and therefore the resultant nonelectrolytically plated layer is firmly bonded to the subbing layer. Thus, the nonelectrolytically plated layer formed on the plastic film has a high bonding strength sufficient to conduct the subsequent procedures.

The above subbing layer for nonelectrolytic plating which comprises a hydrophilic resin having swelling property and fine particles of a metal or a metallic compound dispersed therein, can be formed, for example, by the steps of: preparing an aqueous solution containing a hydrophilic resin having swelling property, metallic salt or metal complex and reducing agent (further protective colloid, if desired); depositing particles of a metallic compound in the aqueous solution to prepare a coating solution containing the particles of metal or metallic compound and the hydrophilic resin; and coating the coating solution on a surface of the plastic film (support; or the adhesive layer thereon) and drying the coated layer.

Otherwise, the subbing layer can be formed by the steps of: preparing an aqueous solution containing a hydrophilic resin having swelling property and metallic salt or metal complex; coating the aqueous solution on a surface of the plastic film (support or the adhesive layer thereon) to form a coated layer; entering a reducing agent into the coated layer to deposit particles of a metallic compound by the reducing reaction of metallic salt or metal complex; and drying the coated layer. In addition, the subbing layer can be also formed by the steps of: preparing a coating solution containing a hydrophilic resin having swelling property and fine particles of a metallic compound; and coating the coating solution on a plastic film (support, or the adhesive layer thereon) and drying the coated layer.

The metal employed for forming the subbing layer generally has electric conductivity. Examples of the metal include Au, Pt, Pd, Ag, Cu, Ni, Fe, Ro, Cr and Sn. Salts, oxides and sulfides of metal can be mentioned, as the metallic compound. Examples of the metallic compound and starting material (e.g., metal complex) include PdS, SnS, $Ag_2S$, $PdCl_2$, $SnCl_2$, AgCl, $PdF_2$, $AgF_2$, $SnF_2$, $PdO_2$, $SnO_2$, $AgO_2$, $HAuCl_4$ and $H_2PtCl_6$. Other than the above examples of metallic salts and metal complex, chlorides, sulfides, fluorides, bromides, iodides, oxides and complexes of other metals can be employed. Examples of the commercially available products include SN-100A and SN-100N (available from Ishihara Sangyo Kaisha, Ltd.) and T1 (Mitsubishi Material Co., Ltd.).

Examples of the reducing agent include sodium hypophosphite, dimethylamine borane, sodium borohydride, potassium borohydride, formaldehyde, hydrazine and ascorbic acid.

The hydrophilic resin employed in the subbing layer generally is a water-soluble resin or a polymer latex. Examples of the hydrophilic resin include gelatin and derivatives thereof (e.g., acyl gelatin such as phthalic gelatin or maleic gelatin; gelatin grafted with acrylic acid, methacrylic acid or amide), polyvinyl alcohol and derivatives thereof, polyvinyl pyrrolidone and derivatives thereof, polyacrylic acid, and acrylic acid/diacrylate copolymer. These polymers can be employed singly or in combination. Cellulose derivatives such as methyl cellulose can be employed together with the above polymer in order to reduce tackiness of the subbing layer and to improve its blocking resistance. Further, phenol or resorcin (to improve swelling property), ionic polymer (to prevent adhesion of dust), anionic or cationic surfactant, copolymer of maleic acid and other monomer described in Japanese Patent Provisional Publication No. 49(1974)-3972, colloidal silica, or an electrolyte such as sodium chloride, may be added to the polymer.

The subbing layer for nonelectrolytic plating is preferably cross-linked. In more detail, a crosslinking agent (e.g., water-soluble crosslinking agent) is added to a coating solution for forming the subbing layer for nonelectrolytic plating to prepare a coating solution, the coating solution is coated on one surface of the support, and then the coated layer is cross-linked by heating, whereby strength of the resultant layer can be increased. Examples of the water-soluble crosslinking agent are described in Japanese Patent Provisional Publications No. 3(1991)-141347 and No. 3(1991)-137637.

Aldehyde compounds (e.g., butylaldehyde) and boric acid can be employed as the water-soluble crosslinking agent in the case that polyvinyl alcohol is employed as the hydrophilic resin. N-methylolurea and poly-N-methylolacrylamide capable of reacting with polymetallic ion (e.g., aluminum, zinc) or carboxyl group can be employed as the water-soluble crosslinking agent in the case that a polymer derived from an acrylic acid derivative is employed as the hydrophilic resin. In the case that gelatin or a derivative thereof is employed as the hydrophilic resin, the following compounds can be employed. The examples include triazine compounds described in U.S. Pat. Nos. 3,325,287, 3,288,775 and 3,549,377, and Belgian Patent No. 6,602,226; dialdehyde compounds described in U.S. Pat. Nos. 3,291,624 and 3,232,764, French Patent No. 1,543,694, and U.K. Patent No. 1,270,578; epoxy compounds described in U.S. Pat. No. 3,091,537 and Japanese Patent Publication No. 49(1974)-26580; vinyl compounds described in U.S. Pat. No. 3,642,486; and ethyleneimine or methylol compounds described in U.S. Pat. No. 3,392,024. Especially preferred are dichloro-s-triazine derivatives such as sodium salt of 2,4-dichloro-6-hydroxy-s-triazine.

In the case that the subbing layer for nonelectrolytic plating is formed on the plastic film (support) via the adhesive layer, the crosslinking agent can be incorporated into the adhesive layer.

In the subbing layer for nonelectrolytic plating, ratio of the hydrophilic resin and the particles of metal or metallic compound generally is in the range of 0.01 to 10,000 (resin/particles) by weight, and preferably in the range of 0.1 to 1,000. The particles of metal or metallic compound generally have a size of 0.0003 to 10 µm, and preferably a size of 0.001 to 1.0 µm.

Further, the subbing layer for nonelectrolytic plating generally has a thickness of 0.005 to 5 µm, and preferably 0.01 to 1 µm.

The subbing layer for nonelectrolytic plating, which contains a metal or metallic compound other than $SnO_2$, may contain fine particles of $SnO_2$ (preferably $SnO_2$ containing antimony (Sb)). $SnO_2$ is preferably contained in the subbing layer in an amount of 10 to 1,000 times as much as that of metal or metallic compound. $SnO_2$ containing antimony preferably contains antimony in an amount of 0.1 to 50 weight %. The particles of $SnO_2$ preferably has a size of 0.01 to 0.5 µm. Otherwise, the undercoat layer may contain $SnO_2$.

The subbing layer for nonelectrolytic plating may be formed by the steps of: forming a layer of a hydrophilic resin having swelling property (on the plastic film or the undercoat layer), and further coating on the hydrophilic resin layer a coating solution in which fine particles of a metal or a metallic compound are dispersed in water and drying the coated layer.

The coating solution for the subbing layer for nonelectrolytic plating may be prepared by mixing a solution containing fine particles of a metal or a metallic obtained by reacting a metallic compound such as a metal salt or metal complex with a solution containing a reducing agent in an amount of $1/1,000$ to $1/10$ based on the amount of the metallic compound and a solution containing hydrophilic resin. The coating solution generally contains fine particles of a metal or a metallic compound in an amount of 0.0001 to 1 weight % (preferably 0.001 to 1 weight %) based on an amount of whole coating solution.

On the subbing layer for nonelectrolytic plating, a nonelectrolytically plated layer is formed by the known method or a method according to the known method. Any nonelectrolytic plating solution can be employed in the invention, and therefore a variety of commercially available solutions can be employed. For copper plating, a EDTA bath and Rochelle bath of copper(II) sulfate are generally employed. For nickel plating, an acid bath using nickel sulfate or nickel chloride, a neutral bath kept at a low temperature of 30° to 60° C., an ammonia-alkaline bath or a caustic alkaline bath can be employed. Further, for cobalt plating, a citric acid bath or a tartaric acid bath using cobalt salt (e.g., cobalt sulfate or cobalt chloride) in the neutral to alkaline conditions can be employed.

The nonelectrolytically plated layer generally has a thickness of 0.1 to 1.0 µm, and preferably 0.2 to 0.5 µm.

The nonelectrolytically plated layer (i.e., metal) permeates inside of the subbing layer for nonelectrolytic plating to bring about anchoring effect between the two layers as mentioned previously, and therefore the nonelectrolytically plated layer is firmly formed on the subbing layer so as not to easily separate from the subbing layer. In more detail, in the case that a metal layer (nonelectrolytically plated layer) is formed on a surface of a plastic film by nonelectrolytic plating (chemical plating) according to the known general method, the surface should be subjected to roughening treatment such as physical roughening treatment utilizing blast or etching treatment (i.e., chemical treatment) using chromic acid mixture. When a metal layer is formed on the surface treated according to the above known method by nonelectrolytic plating, the resultant metal layer (nonelectrolytically plated layer) has satisfactory strength for ordinary handling. However, in the case that the nonelectrolytically plated layer is subjected to various treatments conducted in the invention; i.e., formation of photoresist layer, removal of unexposed photoresist layer, electrolytic plating treatment, and transfer of electrolytically plated layer to substrate, the nonelectrolytically plated layer is liable to separate from the plastic film.

In contrast, in the nonelectrolytically plated layer formed on the subbing layer for nonelectrolytic plating of the invention, the metal phase of the nonelectrolytically plated layer is grown from the inside of the subbing layer and therefore the nonelectrolytically plated layer and the subbing layer are united each other through forming a complex structure in which the nonelectrolytically plated layer is encroached on the subbing layer so as to show anchoring effect. Further, the subbing layer is firmly bonded on the plastic film owing to the provision of the adhesion layer. Hence, the nonelectrolytically plated layer is not separated from the plastic sheet even though subjected to various treatments in the metal pattern forming method of the invention. Further, the nonelectrolytically plated layer is separated from the plastic film for the first time in the transfer procedure in which the plastic film is separated from a substrate.

On the nonelectrolytically plated layer, a photoresist layer is formed. A negative-type photoresist is generally employed as material of the nonelectrolytically plated layer. Further, a photoresist capable of developing with an alkaline aqueous solution is preferred due to easiness of waste liquid treatment. The photoresist layer can be formed on the nonelectrolytically plated layer by means of coating method such as web coating, or can be formed by superposing a resist film (dried film) on the nonelectrolytically plated layer by means of laminating method. In addition, a plating resist or photosensitive solder resist, which is commercially available, can be also employed for the formation of the photoresist layer.

The representative example of the photosensitive sheet employed in the invention has a photosensitive resist layer thereon, which is prepared in the above manner.

The metal pattern forming method employing the photosensitive sheet according to the invention is explained referring to the figures in the attached drawings.

Figure 2:
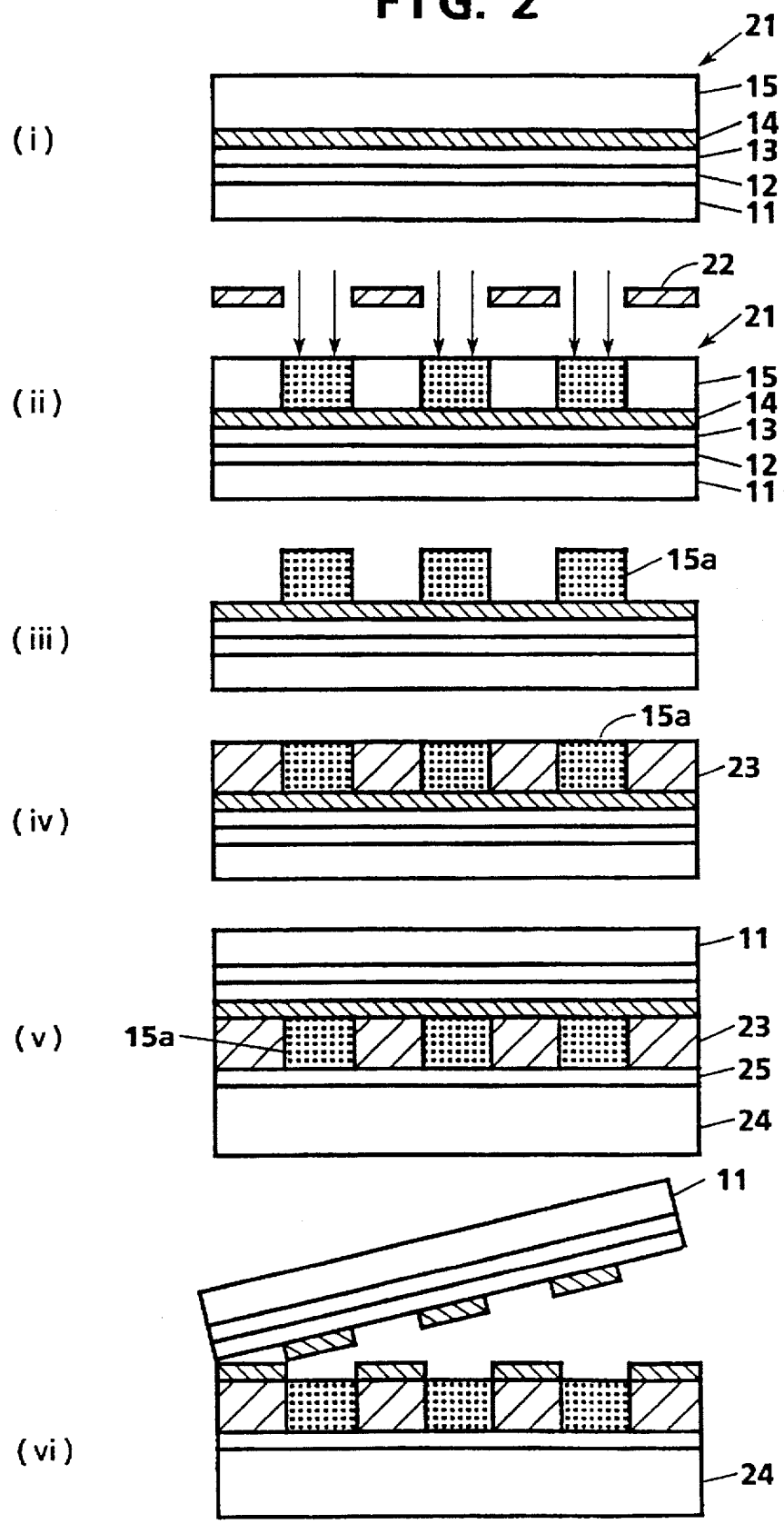
FIG. 2 is a view schematically showing each procedure of the metal pattern forming method of the invention.

FIG. 2 schematically shows a process forming a metal pattern on a substrate according to the metal pattern forming method of the invention.

On the sheet for forming a nonelectrolytically plated layer of the invention shown in FIG. 1, a plastic film 11, an undercoat layer 12 and a subbing layer for nonelectrolytic plating 13 which comprises a hydrophilic resin having swelling property and fine particles of a metal or a metallic compound dispersed therein, a nonelectrolytically plated layer 14 and the photoresist layer (photosensitive resist layer) 15 are provided in order, according to the above methods, whereby the photoresist sheet 21 (shown in (i) of FIG. 2) is prepared.

As shown in (ii) of FIG. 2, the photoresist layer is patternwise (i.e., pattern imagewise) exposed to a light by using a photomask 22 (which is generally in the form of circuit pattern). Subsequently, as shown in (iii) of FIG. 2, the exposed photoresist layer 12 is developed to form a resist pattern 15a on the nonelectrolytically plated layer 14.

The formation of the resist pattern 15a, gives locally exposed nonelectrolytically plated layer (gives an area having resist and an area having no resist). An electrolytically plated layer 23 is formed on the nonelectrolytically plated layer in the area having no resist, as shown in (iv) of FIG. 2.

Electrolytic plating solutions are employable in the invention without specific restriction. Any commercially available solutions or the similar solutions can be employed. For copper plating, a low or high concentration bath containing copper borofluoride, an electroforming bath containing copper(II) sulfate, a gloss bath (e.g., gloss bath containing copper diphosphate) and a general bath can be employed. For nickel plating, a trinickel bath containing nickel sulfate or nickel chloride, a gloss bath and a Weisberg bath can be employed. For the electrolytic plating, not only one metal is employed, but also alloy is employed.

The electrolytically plated layer, which is formed in the metal pattern forming method of the invention, generally has a thickness of 10 to 50 μm. If desired, the thickness may be less than 10 mm, or more than 50 μm. However, the thickness of the electrolytically plated layer is preferably almost equal to that of the resist pattern, by considering the transfer of the resist pattern and the electrolytic plating metal layer which is conducted in the next process.

Subsequently, the resist pattern and the electrolytic plating metal layer are simultaneously transferred onto a substrate 24, as shown in (v) of FIG. 2.

As the substrate, the known substrate or the similar one can be employed. Examples of the substrate include plastic films such as polyimide film and glass-epoxy substrate. The substrate is not necessarily required to have the form of film or sheet.

The transfer of the resist pattern and the electrolytic plating metal layer to the substrate, is generally conducted by utilizing the method comprising the steps of: providing an adhesive layer 25 on the substrate; superposing the photosensitive sheet on the adhesive layer 25 in such a manner that the resist pattern and the electrolytically plated layer are in contact with a surface of the adhesive layer; and combining the photosensitive sheet with the substrate by the application of heat and pressure. Examples of adhesives for forming the adhesive layer, include hot-melt adhesives and thermosetting adhesives. Examples of materials of the adhesives include urea resin, melamine resin, phenol resin and epoxy resin. Further, as the adhesive, a commercially available photo-crosslinkable solder resist can be employed. The adhesive may be in the form of sheet (dried film of adhesive).

After the above transfer, the plastic film of the photosensitive sheet is separated from the composite of the photosensitive sheet and the substrate using hands or a machine as shown in (vi) of FIG. 2, to form a metal pattern on the substrate. The resist pattern remaining on the substrate can be removed, for example, by dissolving the pattern (using solvent), if desired.

In order to improve the smoothness or gloss of the surface of the metal pattern, the surface can be subjected to mild-etching treatment (soft-etching treatment). The mild-etching treatment can be conducted according to the known methods, for example, by treating the surface by the use of a 5 to 10% aqueous solution of ammonium peroxodisulfate or sodium peroxodisulfate (i.e., oxidizing agent) for a time period of from dozens of seconds to a few minutes.

Figure 3:
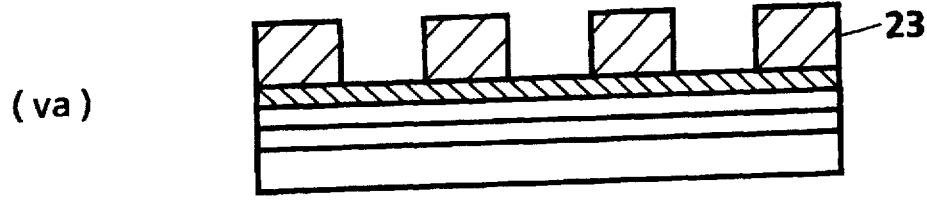
FIG. 3 is a view schematically showing each procedure of another metal pattern forming method of the invention.
Figure 3:
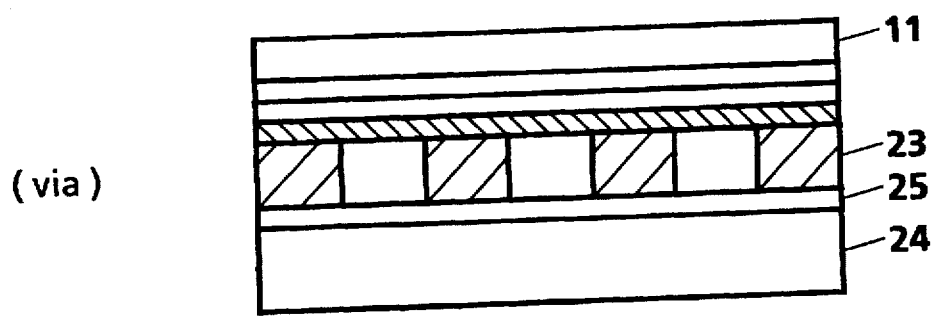
Figure 3:
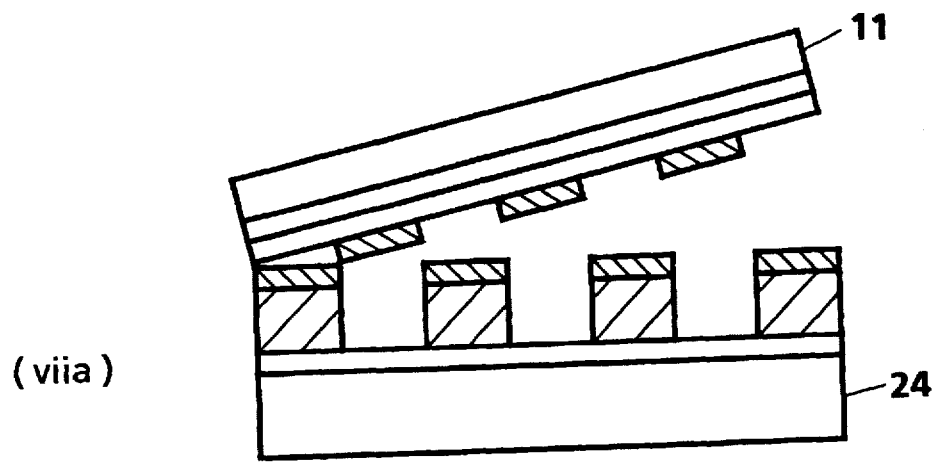

Subsequently, a method for formation of a metal pattern having no resist is explained referring to the figures (FIG. 2 and FIG. 3).

The photosensitive sheet on which the resist pattern 15a and the electrolytically plated layer 23 are formed is shown in (iv) of FIG. 2. By using this sheet, a metal pattern having no resist can be obtained as follows.

FIG. 3 schematically shows a process for formation of a metal pattern having no resist on a substrate employing the sheet of (iv) of FIG. 2.

As shown in (va) of FIG. 3, the resist pattern 15a of the sheet was removed to leave the electrolytically plated layer 23 in the form of pattern, whereby a sheet provided with metal pattern having no resist is obtained.

Removal of the resist pattern (cured resist) can be conducted, for example, by dissolving the resist pattern in an alkaline aqueous solution. As the aqueous alkaline solution, an aqueous solution of 0.5 to 8 weight % of alkaline material such as sodium hydroxide, potassium hydroxide or ammonium hydroxide is mentioned. Removal of the resist pattern is preferably conducted at a temperature of from room temperature to 80° C., and preferably conducted for a time period of 30 seconds to 3 minutes.

Procedures for dissolving the resist pattern can be conducted by utilizing the known resist removal operation. Examples of the known resist removal operation include a method of dipping the substrate having resist in an aqueous alkaline solution; a method of applying ultrasonic an aqueous alkaline solution with dipping the substrate having resist in the aqueous alkaline solution; and a method of spraying an aqueous alkaline solution on the substrate having resist. Further, an automatic resist removing machine, which comprises a substrate conveyor, a spray unit and a recovery unit, can be employed.

Subsequently, the electrolytically plated metal layer 23 is transferred to a substrate 24, as shown in (via) of FIG. 3.

The transfer of the electrolytically plated metal layer to the substrate, is generally conducted by utilizing the method comprising the steps of: providing an adhesive layer 25 on the substrate; superposing the photosensitive sheet on the adhesive layer 25 in such a manner that the resist pattern is in contact with a surface of the adhesive layer; and combining the photosensitive sheet with the substrate by the application of heat and pressure.

After the above transfer, the plastic film 11 of the photosensitive sheet is separated from the composite of the photosensitive sheet and the substrate using hands or a machine as shown in (viia) of FIG. 3, to form a metal pattern having no resist on the substrate.

In order to improve the smoothness or gloss of the surface of the metal pattern, the surface can be subjected to mild-etching treatment (soft-etching treatment).

The resultant substrate provided with metal pattern thereon ((vi) of FIG. 2 or (viia) of FIG. 3) can be employed singly, and two or more of the substrates can be superposed to form a multi-layers structure. Formation of the multi-layers can be easily conducted utilizing the known pre-impregnated glass fiber (cloth). Further, the same or another metal pattern can be formed on the side provided with no metal patterm of the resultant substrate.

The present invention is further described by the following Examples and Comparison Examples.

EXAMPLE 1

(1) Preparation of sheet for formation of nonelectrolytically plated layer

A coating solution having the following composition was coated on a polyethylene terephthalate film (thickness: 100 μm) having been subjected to corona discharge treatment using a wire bar in a coating amount of approx. 6 mL/m$^2$, and dried for 1 minutes in an oven of 170° C. to form an undercoat layer on the film.

| [Composition of coating solution] | |
|---|---|
| Butadiene/styrene copolymer (solid content: 43%, butadiene/styrene = 32/26, by weight) | 13 mL |
| Sodium 2,4-dichloro-6-hydroxy-s-triazine (1.6% aqueous solution) | 9 mL |
| Sodium laurylbenzenesulfonate (1% aqueous solution) | 1.6 mL |
| Distilled water | 78 mL |

The surface of the undercoat layer was subjected to corona discharge treatment, and the coating solution prepared in the following manner was coated on the treated surface of the undercoat layer using a wire bar in a coating amount of approx. 9 mL/m$^2$, and dried for 2 minutes in an oven of 150° C. to form a subbing layer for nonelectrolytic plating.

[Preparation of coating solution for forming a subbing layer for nonelectrolytic plating]

In a mixture of 0.5 g of 5N hydrochloric acid and 11.3 g of pure water, 0.1 g of palladium chloride was dissolved to prepare a solution-A. 0.15 g of poly-N-vinylpyrrolidone (K90, available from Tokyo Kasei Kogyou Co., Ltd., as protective colloid) was dissolved in a mixture of 5 g of 1N aqueous sodium hydroxide and 8.75 g of pure water to prepare a solution-B. Further, 0.1 g of formalin was dissolved in 12.5 g of pure water to prepare a solution-C.

The solution-A and solution-C were simultaneously added slowly to the solution-B while the solution-B was stirred using a stirrer (150 rpm). Color of the solution-B changed with increasing the amount of the solution-A and the solution-C to be added, and termination of addition of the solutions-A and C gave a blackish brown clear palladium colloid solution.

Subsequently, an aqueous solution of 0.5 g of gelatin (681, Nitta Gelatin Co., Ltd.) in 12.5 g of pure water and 0.164 g of a 2% aqueous solution of sodium 2,4-dichloro-6-hydroxy-s-triazine were added to the palladium colloid solution with stirring to prepare a coating solution for forming a subbing layer for nonelectrolytic plating.

(2) Preparation of sheet provided with nonelectrolytically plated layer

The sheet for forming a nonelectrolytically plated layer prepared in (1) above, was cut to prepare a test piece of in the form of square (20 cm×20 cm). The test piece was dipped in an aqueous surfactant solution (Mertex Emplate PC-236, available from Meltex Co., Ltd.; pH: approx. 1) for 5 minutes, and washed with water for one minute, whereby the subbing layer for forming a nonelectrolytically plated layer was swollen. Subsequently, the test piece was dipped in a nonelectrolytic copper plating solution (Merplate CU-390, available from Meltex Co., Ltd.) at approx. 20° C. for 20 minutes. A copper layer (i.e., copper plated layer) deposited on the test piece had an almost even thickness of approx. 0.3 to 0.4 μm. In the plating procedure, release of metal particles from the subbing layer for nonelectrolytic plating was not observed.

An adhesive tape was stuck on the copper layer, and a peeling test in which the tape was peeled from the copper layer was performed. No peeling of the copper layer was observed. Further, surface resistance of the copper layer was measured using a surface resistance measuring equipment for low resistance (MCP-TESTER LORESTA, available from Mitsubishi Petrochemical Co., Ltd.) to give a resistance value of approx. 0.4 to 0.6Ω/sq.

When the copper plated layer was viewed from the surface side, a strong reddish copper color was observed. In contrast, when the copper plated layer was viewed from the back side (PET film side), a reddish copper color was observed, which was weak color compared with the above color and had sparse metallic luster. In more detail, it was confirmed that the metal or metallic compound of the above copper plated layer (i.e., nonelectrolytically plated layer) invades the subbing layer in part to exist in the subbing layer in less concentration than in the nonelectrolytically plated layer, whereby the copper plated layer was incorporated into the subbing layer.

(3) Preparation of photosensitive sheet

An alkali developing type photoresist film (A640, available from Fuji Photo Film Co., Ltd.) was laminated on the nonelectrolytically plated layer (copper layer) of the sheet provided with nonelectrolytically plated layer under the conditions of 2 kg/cm, 105° C. and 1.0 m/min. to prepare a photosensitive sheet.

(4) Formation of negative circuit pattern

The photoresist layer was patternwise exposed to light by using a photomask of circuit pattern. Subsequently, the exposed photoresist layer was developed using an alkaline developing solution to expose the surface of the nonelectrolytically plated layer in the form of circuit pattern, whereby a resist pattern was formed.

(5) Electrolytic plating treatment

The sheet having the resist pattern subjected to the treatment described (4) above, was dipped in an electrolytic plating solution (a copper sulfate bath to which a gloss agent (Caper Gleam P, available from Reelonerl co., Ltd.) was added in the concentration of 5 mL/L) and copper plating was conducted by allowing an electric current of 1.2 A/dm$^2$ to flow at approx. 20° C. for 20 min. to form an electrolytically plated layer on the exposed surface of the nonelectrolytically plated layer.

(6) Transfer of metal pattern onto substrate

Separately, a solder resist film (Backrel 8030, available from Du Pont de Nemours & Co.) was superposed on a glass-epoxy substrate, and they were laminated under the conditions of 2 kg/cm, 105° C. and 1.0 m/min.

On the solder resist film provided on the substrate, the sheet having the nonelectrolytically plated layer obtained above (5) was superposed in such a manner that the nonelectrolytically plated layer was in contact with the surface of the solder resist film, and they were laminated under the conditions of 4 kg/cm, 120° C. and 0.5 m/min. to prepare a composite. Subsequently, the PET (i.e., polyethylene terephthalate film was separated from the composite, and the separation gave the solder resist film of the glass-epoxy substrate to which the copper layer having circuit pattern and a resist having a negative circuit pattern were transferred. The circuit pattern of the copper layer had a resolving power of approx. 50 µm.

Continuously, the surface of the transferred copper layer was treated for 2 minutes using a 12% aqueous solution of ammonium peroxodisulfate (that is, mild etching treatment) and the treatment gave a satisfactory circuit substrate having a lustrous copper surface.

EXAMPLE 2

The procedures of Example 1 were repeated except for forming directly the subbing layer for nonelectrolytic plating without forming the undercoat layer to prepare a sheet for formation of a nonelectrolytically plated layer. However, the subbing layer was formed using a coating solution in which 5 mL of a 1.6% aqueous solution of sodium 2,4-dichloro-6-hydroxy-s-triazine was added to the coating solution of Example 1.

Using the sheet for formation of a nonelectrolytically plated layer, a set of procedures of the formation of nonelectrolytically plated layer, the superposition of photoresist layer, the formation of negative circuit pattern, the electrolytic plating, the transfer procedure and the mild etching were performed in the same manner as in Example 1. As a result, a glass-epoxy substrate (circuit substrate) having the copper layer provided with circuit pattern having resolving power of approx. 50 µm and a resist having a negative circuit pattern was obtained.

EXAMPLE 3

The sheet for formation of a nonelectrolytically plated layer was prepared in the same manner as in Example 1, and the sheet was cut to prepare a test piece of a size (square) of 20 cm×20 cm. The test piece was dipped in an aqueous surfactant solution (Mertex Emplate PC-236, available from Meltex Co., Ltd.; pH: approx. 1) for 5 minutes, and washed with water for one minute, whereby the subbing layer for nonelectrolytic plating was swollen.

Subsequently, the test piece was dipped in a nonelectrolytic nickel plating solution having the following composition at approx. 40° C. for 20 minutes. A nickel layer (nickel plated layer) deposited on the test piece had an almost even thickness of approx. 0.3 µm. In the plating procedure, release of metal particles from the subbing layer for nonelectrolytic plating was not observed.

| [Composition of nonelectrolytic nickel plating bath] | |
|---|---|
| Nickel sulfate | 20 g |
| Sodium citrate | 12 g |
| Sodium hypochlorite | 10 g |
| Sodium acetate | 7 g |
| Ammonium chloride | 2.5 g |
| Distilled water | 450 g |

A photoresist layer was formed on the nonelectrolytically plated layer, and a negative circuit pattern was formed in the same manner as in Example 1. Further, the formation of electrolytically plated layer and the transfer of metal pattern to substrate and further mild etching treatment were conducted in the same manner as in Example 1. As a result, a glass-epoxy substrate (i.e., circuit substrate) having the copper layer provided with a circuit pattern having a resolving power of approx. 50 µm and a resist having a negative circuit pattern was obtained.

EXAMPLE 4

The lustrous surface of the copper layer provided with a circuit pattern obtained in the same manner as in Example 1, was treated at a temperature of 95° C. for 5 minutes with a red oxide treatment liquid which comprised 30 g/L of sodium chlorite, 10 g/L of sodium hydroxide and 10 g/L of sodium orthophosphate, whereby the surface was roughed.

Two sheets of the circuit substrates of which surfaces were roughed were stuck via a pre-impregnated glass fiber in such a manner that the copper layers of the circuits substrates were faced each other, and they were laminated under the press conditions of 30 kg/cm, 70° C. and one hour (cold press treatment), to prepare a superposed circuit substrate. A section of the laminated circuit substrate was observed, which indicated good laminating condition having no production of void.

What is claimed is:

1. A metal pattern forming method comprising the steps of:

exposing patternwise to light a photoresist layer of a photosensitive sheet, the photosensitive sheet comprising a plastic film, a subbing layer for nonelectrolytic metal plating provided thereon comprising a hydrophilic resin having swelling property and fine particles of metal or a metallic compound dispersed therein, a nonelectrolytically plated metal layer provided on the subbing layer and the photoresist layer provided on the nonelectrolytically metal plated layer;

developing the exposed photoresist layer to form a resist pattern on the nonelectrolytically metal plated layer, whereby the nonelectrolytically metal plated layer has an area having resist and an area having no resist;

forming an electrolytically metal plated layer on the nonelectrolytically metal plated layer in the area having no resist;

superposing the photosensitive sheet on a substrate, wherein the resist pattern and the electrolytically metal plated layer are in contact with a surface of the substrate;

applying heat and pressure to the photosensitive sheet on the substrate thereby combining the photosensitive sheet with the substrate; and separating the plastic film from the substrate, keeping both the resist pattern and the electrolytically metal plated layer on the substrate, to form a metal pattern on the substrate.

2. The metal pattern forming method as defined in claim 1, wherein a surface of the metal pattern on the substrate is further subjected to an etching treatment to smooth the surface.

3. The metal pattern forming method as defined in claim 1, wherein the nonelectrolytically metal plated layer and the subbing layer of the photosensitive sheet are united under the condition that a part of the nonelectrolytically metal plated layer enters the subbing layer, whereby no clear boundary is observed between the nonelectrolytically metal plated layer and the subbing layer.

4. The metal pattern forming method according to claim 1, wherein the fine particle of metal or metallic compound have electric conductivity.

5. A photosensitive sheet which comprises a plastic film, a subbing layer for nonelectrolytically metal plating provided thereon comprising a hydrophilic resin having a swelling property and fine particles of a metal or a metallic compound dispersed therein, a nonelectrolytically metal plated layer provided on the subbing layer, and a photoresist layer provided on the nonelectrolytically metal plated layer.

6. The photosensitive sheet as defined in claim 5, wherein the hydrophilic resin is cross-linked.

7. The photosensitive sheet as defined in claim 5, further comprising an undercoat layer comprising an adhesive resin formed between the plastic film and the subbing layer.

8. The photosensitive sheet as defined in claim 5, wherein the nonelectrolytically metal layer and the subbing layer are united under the condition that a part of the nonelectrolytically metal plated layer enters the subbing layer, whereby no clear boundary is observed between the nonelectrolytically metal plated layer and the subbing layer.

9. A metal pattern forming method comprising the steps of:

exposing patternwise to light a photoresist layer of a photosensitive sheet, the photosensitive sheet comprising a plastic film, a subbing layer for nonelectrolytic metal plating provided thereon comprising a hydrophilic resin having a swelling property and fine particles of a metal or a metallic compound dispersed therein, a nonelectrolytically metal plated layer provided on the subbing layer and the photoresist layer provided on the nonelectrolytically metal plated layer;

developing the exposed photoresist layer to form a resist pattern on the nonelectrolytically metal plated layer, whereby the nonelectrolytically metal plated layer has an area having resist and an area having no resist;

forming an electrolytically metal plated layer on the nonelectrolytically metal plated layer in the area having no resist;

removing the resist pattern to leave the electrolytically metal plated layer on the nonelectrolytically metal plated layer;

superposing the photosensitive sheet on a substrate wherein the electrolytically metal plated layer is in contact with a surface of the substrate;

applying heat and pressure to the photosensitive sheet on the substrate thereby combining the photosensitive sheet with the substrate; and separating the plastic film from the substrate, keeping the electrolytically metal plated layer on the substrate, to form a metal pattern on the substrate.

10. The metal pattern forming method as defined in claim 9, wherein a surface of the metal pattern on the substrate is further subjected to an etching treatment to smooth the surface.

11. The metal pattern forming method according to claim 9, wherein the resist pattern is removed by dissolving the resist pattern in an alkaline aqueous solution.

12. A metal pattern forming method comprising the steps of:

exposing patternwise to light a photoresist layer of a photosensitive sheet, the photosensitive sheet comprising a plastic film, a subbing layer for nonelectrolytic metal plating provided thereon comprising a hydrophilic resin having swelling property and fine particles of metal or a metallic compound dispersed therein, a nonelectrolytically plated metal layer provided on the subbing layer and the photoresist layer provided on the nonelectrolytically metal plated layer;

developing the exposed photoresist layer to form a resist pattern on the nonelectrolytically metal plated layer, whereby the nonelectrolytically metal plated layer has an area having resist and an area having no resist;

forming an electrolytically metal plated layer on the nonelectrolytically metal plated layer in the area having no resist;

superposing the photosensitive sheet on a substrate, wherein the resist pattern and the electrolytically metal plated layer are in contact with a surface of the substrate;

combining the photosensitive sheet with the substrate; and separating the plastic film from the substrate, keeping both the resist pattern and the electrolytically metal plated layer on the substrate, to form a metal pattern on the substrate.

* * * * *